United States Patent
Liu et al.

(10) Patent No.: US 7,849,597 B2
(45) Date of Patent: *Dec. 14, 2010

(54) METHOD FOR MAKING HEAT-DISSIPATION DEVICE HAVING VACUUM CHAMBER AND WORKING FLUID THEREIN

(75) Inventors: Tay-Jian Liu, Guangdong (CN);
Chao-Nien Tung, Guangdong (CN);
Cheng-Chi Lee, Guangdong (CN);
Chuen-Shu Hou, Guangdong (CN)

(73) Assignee: Foxconn Technology Co., Ltd., Tu-Cheng, Taipei Hsien (TW)

( * ) Notice: Subject to any disclaimer, the term of this patent is extended or adjusted under 35 U.S.C. 154(b) by 1304 days.

This patent is subject to a terminal disclaimer.

(21) Appl. No.: 11/308,376

(22) Filed: Mar. 20, 2006

(65) Prior Publication Data
US 2007/0062037 A1 Mar. 22, 2007

(30) Foreign Application Priority Data
Aug. 19, 2005 (CN) .......................... 2005 1 0036755

(51) Int. Cl.
*B23P 6/00* (2006.01)

(52) U.S. Cl. .............................. 29/890.032; 29/890.03; 29/801; 29/773; 29/776; 29/778; 165/104.18; 165/104.19; 165/104.21; 165/104.26; 165/104.27

(58) Field of Classification Search ............ 29/890.032, 29/890.03, 801, 778, 773, 776; 165/104.18, 165/104.19, 104.14, 104.27, 104.32, 104.26
See application file for complete search history.

(56) References Cited

U.S. PATENT DOCUMENTS
4,341,000 A * 7/1982 Stockman .............. 29/890.032

FOREIGN PATENT DOCUMENTS
JP       10-238976      9/1998

* cited by examiner

*Primary Examiner*—Rick K Chang
(74) *Attorney, Agent, or Firm*—Winston Hsu; Scott Margo

(57) ABSTRACT

A method (100) and an apparatus for manufacturing a heat-dissipation device (10) with a vacuum chamber and a working fluid therein are disclosed. The method includes the following steps: vacuuming a hollow metal casing (12) through a first open end (121) thereof until an interior of the casing reaches a predetermined vacuum degree; sealing the first open end; filling a predetermined quantity of working fluid into the casing through a second open end (123) thereof; and sealing the second open end. The apparatus includes a vacuum pump, a liquid-storage tank and a set of processing device, as used respectively for the above vacuuming, liquid-filling and sealing steps. By this apparatus, the heat-dissipation device can be manufactured at a same place without the requirement to shift the casing from one place to another place during the manufacture of the heat-dissipation device.

14 Claims, 4 Drawing Sheets

METHOD FOR MAKING HEAT-DISSIPATION DEVICE HAVING VACUUM CHAMBER AND WORKING FLUID THEREIN

FIELD OF THE INVENTION

The present invention relates generally to a heat-dissipation device, and more particularly to a method for making the heat-dissipation device which has a vacuum chamber and a working fluid therein, such as a heat pipe or a vapor chamber-based heat spreader. The present invention relates also to an apparatus for making such a heat-dissipation device.

DESCRIPTION OF RELATED ART

Heat pipes and vapor chamber-based heat spreaders are highly efficient heat-dissipation devices used for dissipating heat from heat generating components such as central processing units (CPUs) of computers. As a common characteristic, these heat-dissipation devices have a vacuum chamber therein and contain in the vacuum chamber a quantity of working fluid. Under a phase change mechanism of the working fluid, these heat-dissipation devices are capable of dissipating a large amount of heat from the heat generating components. Vapor chamber-based heat spreaders generally have a plate-type configuration and therefore are particularly advantageous in transferring heat from a concentrated heat source uniformly to a large heat-dissipation surface such as a large heat sink base.

As with heat pipes, they generally have an elongated configuration and therefore are particularly advantageous in bringing heat from one location to another remote location. A heat pipe generally consists of a pipe body defining therein a vacuum chamber, and a wick structure lining an inner wall of the pipe body. The heat pipe has an evaporating end and an opposite condensing end. In practice, the evaporating end is maintained in thermal contact with a heat source and the condensing end is thermally connected with, for example, a plurality of metal fins, so that the heat of the heat source is capable of being transferred from the evaporating end to the condensing end for dissipation by the metal fins, whereby the heat source is cooled down.

Currently, a method for making a heat pipe involves the following steps. First, a hollow pipe body having an open end and a closed end is provided. Then, a predetermined amount of working fluid is filled into the pipe body via its open end at one place. After that, the pipe body with the working fluid therein is sent to another different place where the air originally in the pipe body is pumped out of the pipe body so as to generate a predetermined vacuum condition in the pipe body. The open end of the pipe body then is flattened so as to temporarily seal the pipe body. Thereafter, the temporarily sealed pipe body is sent to a further different place where an excessive distal end portion of the flattened open end is cut away. Finally, the pipe body after the cutting step is further sent to a different place where the flattened open end is soldered so as to permanently and hermetically seal the pipe body.

In the manufacture of the heat pipe, the working fluid is filled into the pipe body before the air in the pipe body is pumped out of the pipe body. It is therefore easy to lead to the problem that a portion of the working fluid previously filled into the pipe body will also be inadvertently pumped out during the following air-pumping step. This will result in unpredictability regarding the amount of working fluid finally sealed within the heat pipe.

In the foregoing method, the flattening step, by its very nature, generally cannot seal the pipe body hermetically. Therefore, after the pipe body with the vacuum condition therein is temporarily sealed, it is expected to perform the following cutting step and soldering step as soon as possible so as to hermetically seal the pipe body timely. However, since the steps of the foregoing method are carried out at different places, the pipe body requires to be shifted frequently from one place to another different place during the whole manufacturing process of the heat pipe. In this situation, it may take a relatively long period of time after the pipe body is temporarily sealed but before it is finally hermetically and permanently sealed. During this long period of time, the ambient air accordingly has a chance to penetrate through the temporarily but not hermetically sealed open end to cause drop of vacuum degree or even loss of the vacuum condition in the pipe body.

Therefore, it is desirable to provide a method of making a heat pipe (or a vapor chamber-based heat spreader), which overcomes the foregoing disadvantages. It is also desirable to provide an integrated manufacturing apparatus for the heat pipe (or the vapor chamber-based heat spreader) so that during the whole manufacturing process thereof, the heat pipe (or the vapor chamber-based heat spreader) does not requires to be shifted from place to place.

SUMMARY OF INVENTION

The present invention relates, in one aspect, to a method of manufacturing a heat-dissipation device with a vacuum chamber and a working fluid therein. Such heat-dissipation device includes, but is not limited to, a heat pipe and a vapor chamber-based heat spreader. The method includes the following steps: (1) providing a hollow metal casing having first and second open ends; (2) vacuuming the hollow metal casing through the first open end thereof until an interior of the hollow metal casing reaches a predetermined vacuum degree; (3) sealing the first open end of the hollow metal casing; (4) filling a predetermined quantity of working fluid into the hollow metal casing through the second open end thereof; and (5) sealing the second open end of the hollow metal casing. In the present method, the working fluid for the heat pipe is filled into the pipe body after the pipe body is vacuumed. The amount of working fluid sealed within the heat pipe will not affected by the vacuuming step. Accordingly, the heat pipe made by this method is sealed with a precisely predetermined amount of working fluid therein.

The present invention relates, in another aspect, to an integrated manufacturing apparatus for use in manufacturing the heat-dissipation device. The apparatus includes a vacuum pump adapted to connect with the first open end of the hollow metal casing for vacuuming the hollow metal casing; a liquid-storage tank is adapted to connect with the second open end of the hollow metal casing for filling a predetermined quantity of working fluid into the hollow metal casing after a predetermined vacuum degree is formed inside the hollow metal casing by the vacuum pump; at least a set of processing device is adapted for sealing the first and second open ends of the hollow metal casing; and a positioning mechanism is for locating the hollow metal casing so as to maintain the hollow metal casing at a same place when hollow metal casing is processed into the heat-dissipation device. With this integrated apparatus, the heat-dissipation device can be manufactured continuously, without the requirement to shift the hollow metal casing from one place to another place during the whole manufacturing process of the heat-dissipation device. This integrated manufacturing apparatus helps to hermetically seal the hollow metal casing quickly after a vacuum condition is formed in the hollow metal casing.

Other advantages and novel features of the present invention will become more apparent from the following detailed description of preferred embodiment when taken in conjunction with the accompanying drawings, in which:

DETAILED DESCRIPTION

Figure 1:
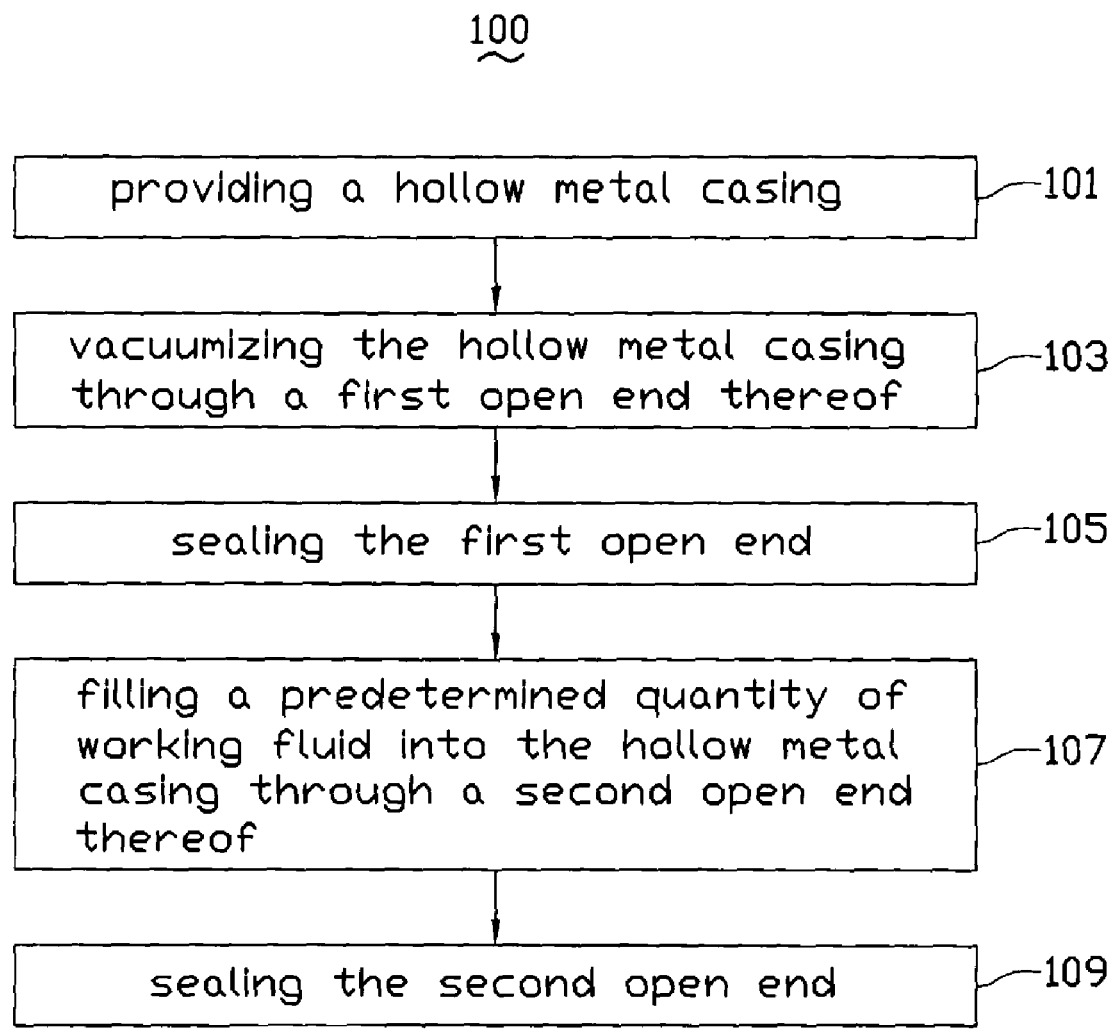
FIG. 1 is a flow chart showing a preferred method of the present invention used for making a heat pipe.
Figure 2:
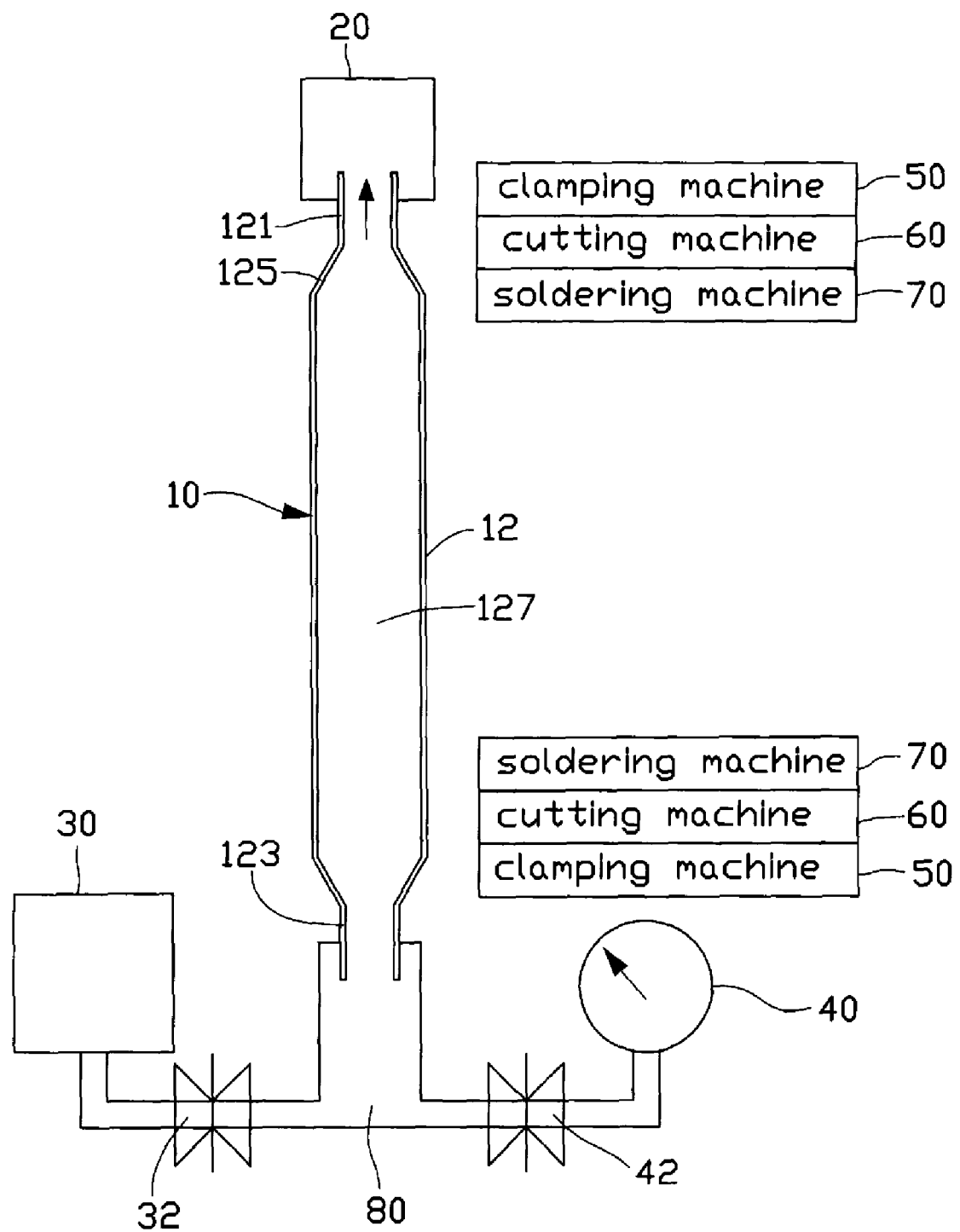
FIG. 2 is a block diagram illustrating an apparatus for making the heat pipe in accordance with one embodiment of the present invention.

FIG. 1 is a flow chart showing a preferred method 100 of the present invention for manufacturing heat pipes. A heat pipe is a heat-dissipation device that has a vacuum chamber and a working fluid therein. FIG. 2 illustrates an apparatus for practicing the method 100 in manufacturing a heat pipe 10. The heat pipe 10 includes a hollow pipe body 12 having a first open end 121 and a second open end 123 opposing the first open end 121. The pipe body 12 is made of high thermally conductive metal material such as copper or aluminum. Each of the open ends 121, 123 has a diameter smaller than that of the pipe body 12, and is connected with the pipe body 12 via a transitional, tapered pipe section 125. The pipe body 12 defines therein a chamber 127 in which a wick structure (not shown) is preferably provided. The wick structure for the heat pipe 10 may include fine grooves integrally formed in an inner wall of the pipe body 12, mesh or bundles of fiber inserted into the pipe body 12 and held against the inner wall thereof, or sintered powders combined to the inner wall of the pipe body 12 by a sintering process. Although the method 100 is particularly suitable for use in manufacturing heat pipes, it should be recognized that this method 100 can also be suitably applied for making a vapor chamber-based heat spreader, which also requires therein a vacuum chamber and a working fluid.

For carrying out the method 100, the present invention also provides an integrated manufacturing apparatus for manufacturing the heat pipe 10. As illustrated in FIG. 2, the apparatus includes a vacuum pump 20, a liquid-storage tank 30, a vacuum gauge 40, two clamping machines 50, two cutting machines 60 and two soldering machines 70. The vacuum pump 20 is hermetically connected with the first open end 121 of the pipe body 12. The liquid-storage tank 30 and the vacuum gauge 40 are commonly and hermetically connected with the second open end 123 of the pipe body 12. In particular, the liquid-storage tank 30 and the vacuum gauge 40 are commonly connected to the second open end 123 via a bifurcated tube 80. The liquid-storage tank 30 stores therein a predetermined quantity of working fluid. The working fluid stored in the liquid-storage tank 30 may be water, methanol or the like. A valve 32 is arranged between the liquid-storage tank 30 and the second open end 123 of the pipe body 12. Similarly, a valve 42 is arranged between the vacuum gauge 40 and the second open end 123. These clamping machines 50, cutting machines 60 and soldering machines 70 are evenly divided into two groups, with each group being provided near a corresponding open end of the pipe body 12.

With this integrated manufacturing apparatus, all the processing procedures to form the heat pipe 10 can be carried out entirely by this apparatus, and throughout the whole manufacturing process of the heat pipe 10, the pipe body 12 can be maintained at a same place, without the requirement to shift the pipe body 12 from one place to another place. In operation, the pipe body 12 is vertically positioned by a positioning mechanism (not shown in the drawings) such as a gripping device of the apparatus, in such a manner that the first open end 121 of the pipe body 12 is located higher than the second open end 123 of the pipe body 12 (step 101). Then, the valve 42 is turned on, and the vacuum pump 20 operates to draw the air originally in the pipe body 12 out of the pipe body 12 (step 103). At this moment, the vacuum gauge 40 is used to detect the vacuum degree formed in the pipe body 12 by this air-drawing step 103. After the chamber 127 of the pipe body 12 reaches a predetermined vacuum degree, the valve 42 is turned off. The clamping machine 50, cutting machine 60 and soldering machine 70 located near the first open end 121 of the pipe body 12 are actuated orderly to quickly seal the first open end 121 (step 105). Specifically, the first open end 121 is firstly cramped into a flattened configuration by the clamping machine 50. Successively, an excessive distal end portion of the flattened open end 121 is cut away by the cutting machine 60. Shortly thereafter, the flattened open end 121 is soldered by the soldering machine 70 so as to hermetically and permanently seal the first open end 121.

Immediately after the first open end 121 is sealed, the valve 32 is turned on, and the predetermined quantity of working fluid previously stored in the liquid-storage tank 30 is accordingly sucked into the chamber 127 of the pipe body 12 due to the vacuum condition formed in the chamber 127 (step 107). After that, the valve 32 is turned off, and the clamping machine 50, cutting machine 60 and soldering machine 70 located near the second open end 123 of the pipe body 12 are actuated to hermetically and permanently seal the second open end 123 (step 109) in substantially the same manner as described above for sealing the first open end 121 (step 105). As a result, the heat pipe 10 is vacuum-sealed with the predetermined quantity of working fluid therein.

In the manufacture of the heat pipe 10, the working fluid for the heat pipe 10 is filled into the pipe body 12 after the pipe body 12 is vacuumed. In this manner, the problem in relation to the conventional art that the previously filled working fluid will be inadvertently drawn out of the pipe body in the following air-drawing step is effectively eliminated. In addition, the multiple steps of the method 100, including the air-drawing step 103, the liquid-filling step 107 and the sealing steps 105, 109, are carried out continuously. During the whole manufacturing process of the heat pipe 10, the pipe body 12 does not require to be moved from one place to another place. Especially, the clamping step, the cutting step and the soldering step, as used to seal the first and second open ends 121, 123 of the pipe body 12, are capable of being carried out continuously in a very short time period. Thus, the potential risk that the ambient air will penetrate into the pipe body 12 through the first and second open ends 121, 123 to cause drop of vacuum degree in the pipe body 12 is minimized. As a result, the heat pipe 10 is assured of a good quality since a precise amount of working fluid and a precise vacuum degree are maintained therein.

Figure 3:
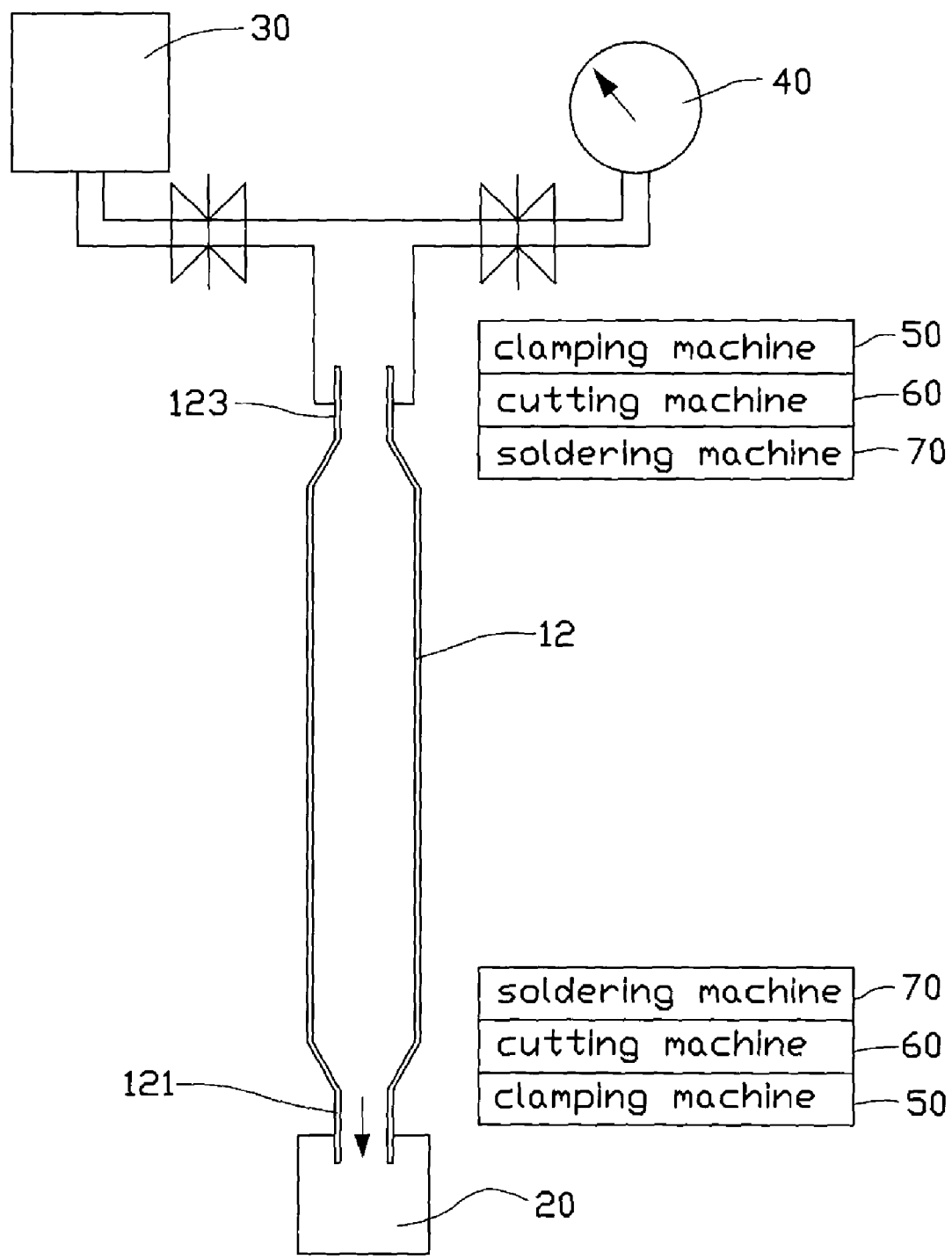
FIG. 3 is a block diagram illustrating an apparatus for making the heat pipe in accordance with an alternative embodiment of the present invention.

FIG. 3 illustrates an alternative embodiment of the integrated manufacturing apparatus of the present invention, in which the first open end 121 of the pipe body 12 to which the vacuum pump 20 is connected is located lower than the second open end 123 of the pipe body 12 to which the liquid-storage tank 30 and the vacuum gauge 40 are connected. In this situation, the predetermined amount of working fluid previously stored in the liquid-storage tank 30 is easier to be filled into the pipe body 12 due to the weight of the working fluid in addition to the suction force generated by the vacuum condition of the pipe body 12. It should be recognized that during the manufacture of the heat pipe 10, the pipe body 12 may also be horizontally positioned or positioned aslant in the manufacturing apparatus. The other structures and principles of this embodiment are substantially the same as that of the first embodiment of FIG. 2, and descriptions thereof are omitted.

Figure 4:
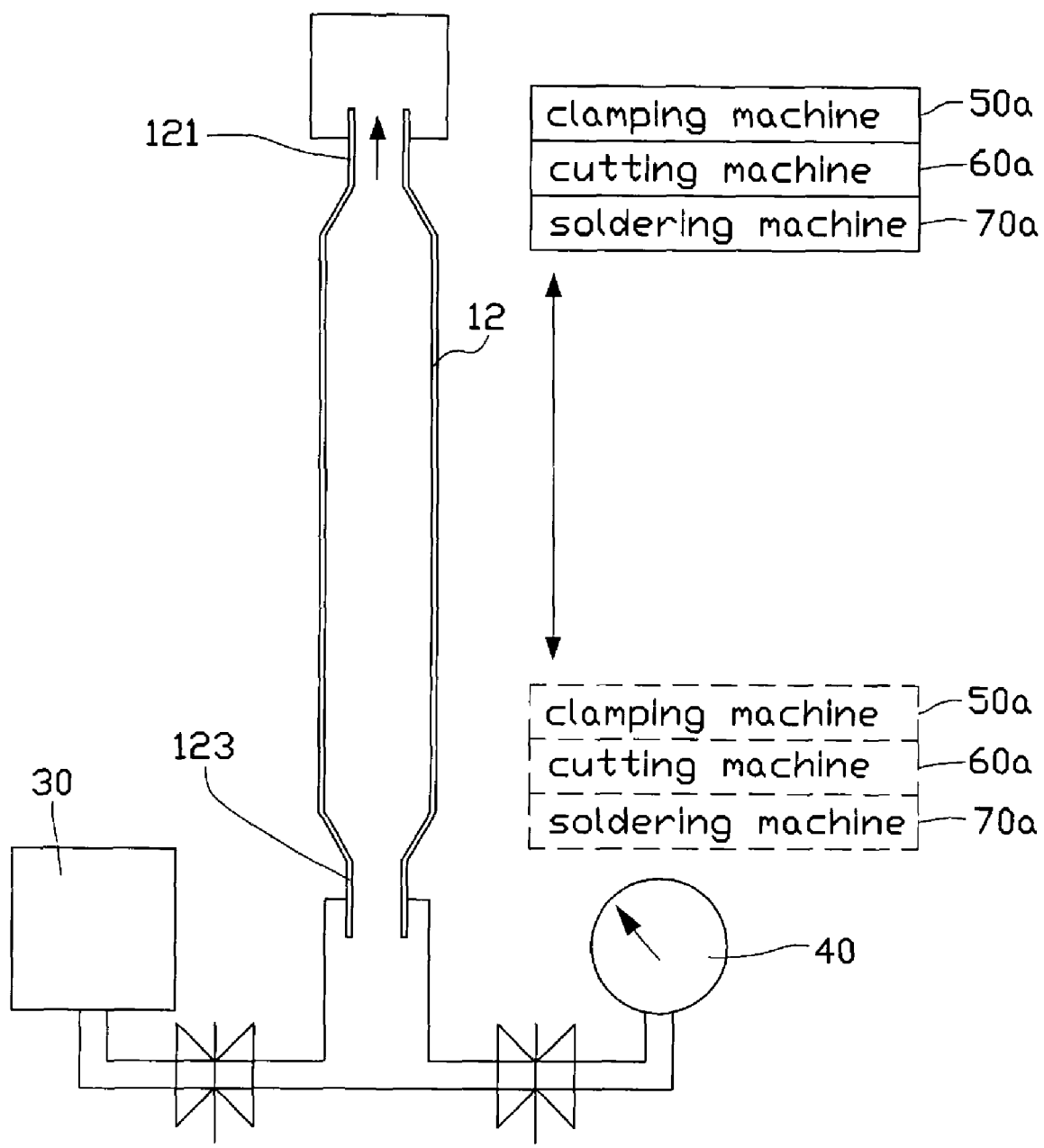
FIG. 4 is a block diagram illustrating an apparatus for making the heat pipe in accordance with another embodiment of the present invention.

FIG. 4 illustrates another embodiment of the integrated manufacturing apparatus of the present invention, in which only a clamping machine 50*a*, a cutting machine 60*a* and a soldering machine 70*a* are provided. These processing machines 50*a*, 60*a*, 70*a* are movable between the first and second open ends 121, 123 of the pipe body 12 in order to execute sealing jobs to the first and second open ends 121, 123. The other structures and principles of this embodiment are substantially the same as that of the first embodiment of FIG. 2.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A method of manufacturing a heat-dissipation device with a vacuum chamber and a working fluid therein, comprising the steps of:
    providing a hollow metal casing having first and second open ends;
    vacuuming the hollow metal casing through the first open end thereof until an interior of the hollow metal casing reaches a predetermined vacuum degree;
    sealing the first open end of the hollow metal casing;
    filling a predetermined quantity of working fluid into the hollow metal casing through the second open end thereof; and
    sealing the second open end of the hollow metal casing.

2. The method of claim 1, wherein the vacuuming step, the sealing steps and the filling step are carried out at a same place.

3. The method of claim 1, wherein the vacuuming step comprises pumping the air in the hollow metal casing out by a vacuum pump which is connected to the first open end of the hollow metal casing.

4. The method of claim 1, wherein the predetermined quantity of working fluid is stored in a storage tank which is connected to the second open end of the hollow metal casing.

5. The method of claim 4, wherein the predetermined vacuum degree in the hollow metal casing is detected by a vacuum gauge which is connected to the second open end of the hollow metal casing.

6. The method of claim 1, wherein each of the sealing steps comprises firstly clamping the corresponding open end, then cutting an excessive distal end portion of the corresponding open end and subsequently soldering the corresponding open end; the clamping step, the cutting step and the soldering step being performed by a clamping machine, a cutting machine and a soldering machine, respectively.

7. The method of claim 6, wherein the clamping machine, the cutting machine and the soldering machine are provided near each of the first and second open ends of the hollow metal casing.

8. The method of claim 6, wherein the clamping machine, the cutting machine and the soldering machine are movable between the first and second open ends of the hollow metal casing so as to seal both the first and second open ends.

9. The method of claim 1, wherein during the vacuuming step and filling step, the hollow metal casing is positioned in a manner that the first open end thereof is located higher than the second open end.

10. The method of claim 1, wherein during the vacuuming step and filling step, the hollow metal casing is positioned in a manner that the first open end thereof is located lower than the second open end.

11. The method of claim 1, wherein the heat-dissipation device is one of a heat pipe and a vapor chamber-based heat spreader.

12. A method for manufacturing a heat pipe, the method comprising:
    providing a pipe body having opposite first and second open ends each with a diameter smaller than that of the pipe body;
    hermetically connecting the first open end with a vacuum pump and the second open end with a working fluid tank receiving a working fluid therein via a first valve and a pressure gauge via a second valve;
    operating the vacuum pump to vacuum the pipe body wherein the second valve is opened, wherein the pressure gauge detects a degree of vacuum in the pipe body and the first valve is closed;
    sealing the first open end;
    feeding the working fluid in the working fluid tank into the pipe body, wherein the first valve is opened and the second valve is closed; and
    sealing the second open end.

13. The method of claim 12, wherein each of the sealing steps is achieved in sequence by a clamping machine for cramping a corresponding open end, a cutting machine for cutting an excessive distal end portion of the corresponding cramped open end, and a soldering machine for soldering the corresponding cramped open end.

14. The method of claim 12, wherein during the sealing steps, the pipe body is held in position.

* * * * *